(12) United States Patent
Narita et al.

(10) Patent No.: US 6,288,450 B1
(45) Date of Patent: Sep. 11, 2001

(54) WIRING STRUCTURE FOR SEMICONDUCTOR DEVICE

(75) Inventors: Tadashi Narita; Makiko Nakamura, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/449,908

(22) Filed: Dec. 2, 1999

(30) Foreign Application Priority Data

Jul. 28, 1999 (JP) .................................................. 11-212976

(51) Int. Cl.$^7$ ................................................... H01L 23/48
(52) U.S. Cl. .......................... 257/763; 257/764; 257/765; 257/767
(58) Field of Search ..................... 257/750, 751, 257/763, 764, 765, 767, 771, 774, 775, 776, 773

(56) References Cited

U.S. PATENT DOCUMENTS

| | | | |
|---|---|---|---|
| 4,017,890 | * 4/1977 | Howard et al. | 257/764 |
| 4,485,675 | * 12/1984 | Geffken et al. | 257/767 |
| 5,439,731 | 8/1995 | Li et al. | 428/209 |
| 5,597,745 | 1/1997 | Byun et al. | 438/653 |
| 5,712,510 | * 1/1998 | Bui et al. | 257/758 |
| 5,869,901 | * 2/1999 | Kusuyama | 257/263 |
| 6,191,481 | * 2/2001 | Bothra et al. | 257/734 |

FOREIGN PATENT DOCUMENTS

| | | | |
|---|---|---|---|
| 0 233 698-A2 | * 11/1986 | (EP) | H01L/23/52 |
| 10-335330 | 12/1998 | (JP) | H01L/21/3205 |

OTHER PUBLICATIONS

May, J. S., "Electromigration Characteristics of Vias in Ti:W/Al–Cu (2wt%) Multilayer Metallization," IEEE International Reliability Physics Symposium, 1991, 29th Annual Proceedings, pp. 91–96.*

I.A. Blech, "Electromigration in thin aluminum films on titanium nitride," Journal of Applied Physics, vol. 47, No. 4, Apr. 1976, pp. 1203–1208.

Masaya Hosaka et al., "Ti Layer Thickness Dependence on Electromigration Performance of Ti/AlCu Metallization," IEEE 98CH36173. 36th Annual International Reliability Physics Symposium, Reno, Nevada, 1998, pp. 329–334.

* cited by examiner

Primary Examiner—T. N. Quach
(74) Attorney, Agent, or Firm—Jones Volentine, PLLC

(57) ABSTRACT

There is disclosed a wiring structure for a semiconductor device being excellent in the resistance against electromigration and being able to lengthen a life of the wiring. The wiring structure is comprised of a refractory metal layer and an aluminum alloy layer being stacked on the refractory metal layer. The wiring structure contains a compound layer produced between the refractory metal layer and the aluminum alloy layer. The refractory metal layer is parted in the extended direction of the wiring to prevent the compound layer produced between the refractory metal layer and the aluminum alloy layer from being ranged in the extended direction of the wiring. A length of an interval between the parted refractory metal layer portions is set to exceed a value being twice as large as a thickness of the compound layer. This prevents the compound layer growing between faces of refractory metal layer portion being opposite to each other being ranged each other.

6 Claims, 7 Drawing Sheets

WIRING STRUCTURE FOR SEMICONDUCTOR DEVICE

BACKGROUND OF THE INVENTION

1. Field of the Invention

The present invention relates to a wiring structure for a semiconductor device and a method for manufacturing the same.

2. Description of the Related Art

Aluminum having the second best conductivity after copper is used as a main material for wiring of a semiconductor device such as an integrated circuit (IC). However, aluminum wiring is vulnerable to breakage caused by electromigration. In order to increase the resistance against electromigration and to lengthen a life of the wiring, technologies are proposed to use an aluminum alloy such as Al—Cu and Al—Si—Cu or to introduce a stacked structure provided with the aluminum alloy as an upper layer and with a refractory metal layer composed of Ti, TiN, WSi or the like as a lower layer.

By forming the aluminum alloy layer, through the refractory metal layer, on an insulating layer on the semiconductor substrate such as Si, the aluminum alloy of high quality having few defects that may cause such electromigration and having a large grain diameter can be formed, and because the refractory layer used as the lower layer functions as a bypass for parts suffering from electromigration, the life of the wiring can be lengthened accordingly.

However, it was reported by M. Hosaka et al., in Proceedings of 36th International Reliability Physics Symposium (1998, P329) that, when the aluminum alloy layer is formed on the refractory metal layer described above, a compound layer composed of $Al_3Ti$ is produced between the aluminum alloy layer and the refractory metal layer and an interface of compound layers acts as a diffusion path for aluminum. If such compound layers produced between aluminum and the refractory metal are formed in an ranged manner on the wiring region, it reduces remarkably the resistance against electromigration.

SUMMARY OF THE INVENTION

In view of the above, it is an object of the present invention to provide a wiring structure being excellent in the resistance against electromigration and being able to lengthen a life of the wiring and a method for manufacturing the same.

According to a first aspect of the present invention, there is provided a wiring structure for a semiconductor device comprising:

a refractory metal layer formed on a semiconductor substrate;

an aluminum alloy layer stacked on the refractory metal layer;

a stacked structure wherein a layer of a compound composed of aluminum contained in said aluminum alloy and of a metal contained in the refractory metal is produced between both layers;

whereby the refractory metal layer is parted by the aluminum alloy layer in an extended direction of wiring and a length of an interval between parted refractory metal layer portions exceeds a value being twice as large as a thickness of said compound layer.

Furthermore, according to the configuration of the present invention, since the refractory metal is parted or separated in the extended direction of the wiring and the length of the interval between the parted refractory metal layer portions is set to be a value being twice as large as the thickness of the compound layer, it is possible to prevent the compound layer produced between the refractory metal layer and the aluminum alloy layer from growing in a ranged manner in the extended direction.

In the foregoing, a preferable mode is one wherein a length of the refractory metal layer portion in the direction of the wiring is smaller than Blech's critical length. By setting the length of the refractory metal layer portion in the direction of the wiring to be smaller than the Blech's critical length, the resistance against electromigration can be increased more. Though the Blech's critical length is increased or decreased depending on stress introduced into the aluminum alloy layer disposed on the refractory metal layer, since it is approximately 100 μm, the length of refractory metal layer in the direction of the wiring is preferably about 100 μm or less.

Also, a preferable mode is one wherein the parted region between the refractory metal layer portions extends at an oblique angle with respect to an extended direction of the wiring.

Also, a preferable mode is one wherein the refractory metal layer is stacked on an insulating layer formed on the semiconductor substrate.

Also, a preferable mode is one wherein the insulating layer, on which the refractory metal layers are stacked, is provided with a concave portion in which a distance between its side walls being opposite to each other increases as it moves from its top part to its bottom part.

Furthermore, a preferable mode is one wherein the refractory metal layer is composed of titanium.

According to a second aspect of the present invention, there is provided a method for forming wiring for semiconductor device comprising the steps of:

forming refractory metal layers each having almost the same thickness on an insulating layer on a semiconductor substrate;

performing selectively etching processing on the refractory metal layers to make the insulating layer partially exposed from the refractory metal layers along a wiring region on which wiring is established;

forming an aluminum alloy layer on the refractory metal layer containing the region in which the insulating layer is exposed; and taking off unnecessary portion of a stacked structure to form wiring for the structure containing the refractory metal layer and the aluminum alloy layer along the wiring region.

In the foregoing, it is preferable that a length of the exposed region of the insulating layer to be exposed by the etching processing performed on the refractory metal layer along an extended direction of the wiring region exceeds a value being twice as large as a thickness of a compound film produced by a reaction of a metal contained in the refractory metal layer with aluminum contained in said aluminum alloy layer and a width being rectangular to the extended direction in the exposed region is larger than that of the wiring region.

Also, it is preferable that a length between the exposed regions in the refractory metal layer is smaller than Blech's critical length.

Also, it is preferable that the exposed region in the refractory metal layer is defined by a rectangular etching hole formed along the wiring region.

Also, it is preferable that the exposed region on the refractory metal layer is defined by an etching trench arranged on the wiring region in a lattice form in a manner that it forms a tilt angle with respect to the extended direction of the wiring region.

Also, it is preferable that a length of a diagonal line of a refractory metal line partitioned by the lattice-like etching trench is smaller than Blech's critical length.

According to a third aspect of the present invention, there is provided a method for forming wiring comprising the steps of:

forming an etching hole along a wiring region on a semiconductor substrate wherein a distance between its side walls being opposite to each other increases as it moves from its top part to its bottom part;

stacking a refractory metal layer on an insulating film having its thickness that does not completely cover an etching hole without allowing said refractory metal layer to grow along side walls of said etching hole from a bottom of the etching hole to its top in an ranged manner;

forming an aluminum alloy layer on the refractory metal layer containing the region on which the etching hole is formed; and taking off, by using an etching method, unnecessary parts of the stacked structure in order to form wiring of a stacked structure containing the refractory metal layer and the aluminum alloy layer along the wiring region.

In the foregoing, a preferable mode is one wherein a length, along the extended direction of the wiring region, of a vacant portion of the refractory metal layer formed to respond to the etching hole of the insulating film exceeds a value being twice as large as a thickness of a compound film produced by the reaction of the refractory metal layer with the aluminum alloy layer and a length being rectangular to the extended direction in the vacant portion is larger than a width of the wiring region.

Also, a preferable mode is one wherein a length of the refractory metal layer portion in the vacant portion of the refractory metal layer along the wiring region is smaller than Blech's critical length.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Best modes of carrying out the present invention will be described in further detail using various embodiments with reference to the accompanying drawings.

First Embodiment

Figure 1:
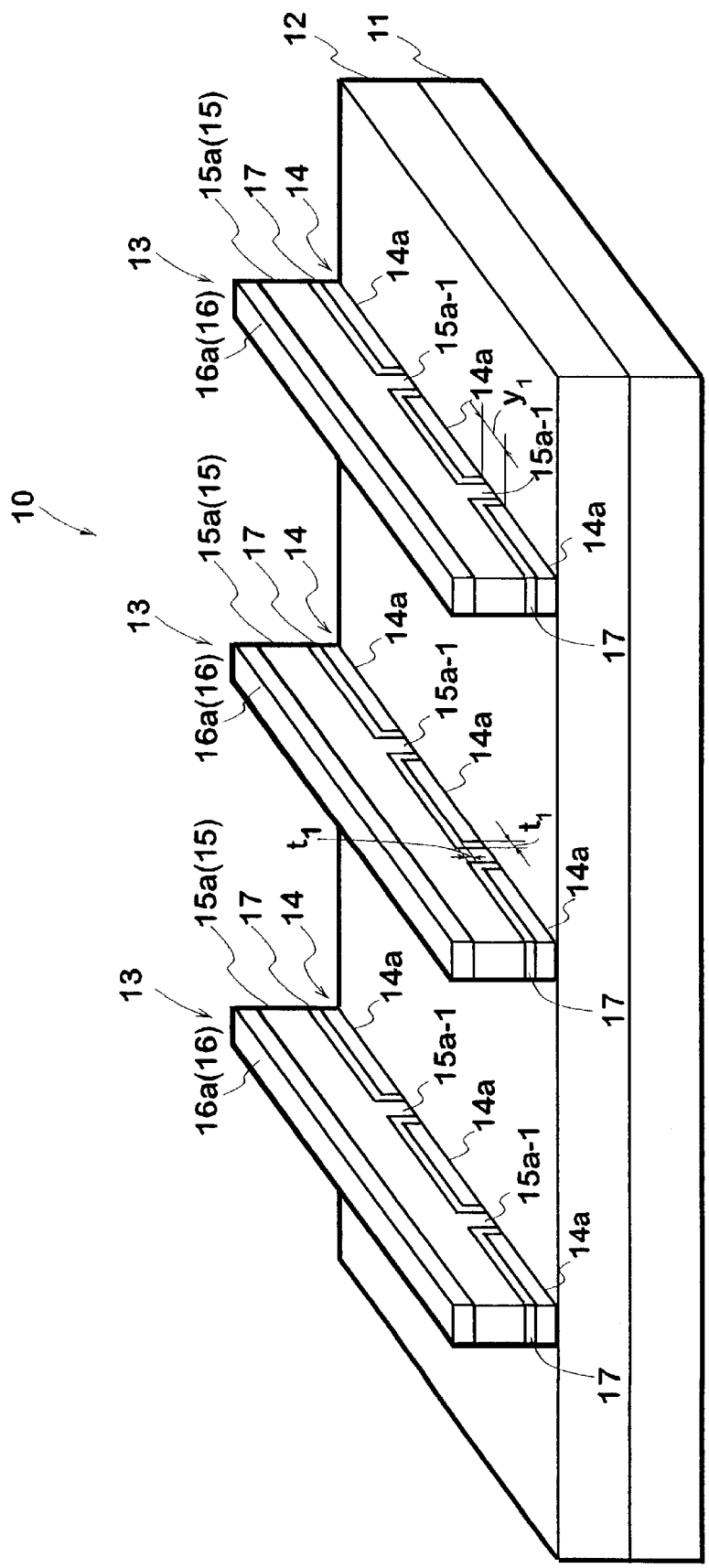
FIG. 1 is a perspective view showing a wiring structure for a semiconductor device having a semiconductor substrate according to a first embodiment of the present invention.

FIG. 1 is a schematic diagram showing a wiring structure applied to a semiconductor device having a semiconductor substrate according to a first embodiment of the present invention. As depicted in FIG. 1, the wiring structure is formed on an insulating film 12 such as silicon oxide covered on, for example, Si (silicon) semiconductor substrate 11.

As is known in a conventional integrated circuit technology, though not shown, a large number of transistors such as MOS transistors or other circuits, wiring circuits and the like are built on the semiconductor substrate 11 and the above insulating films 12 as interlayer dielectrics are formed on them in such a manner that the films can cover them.

On the insulating film 12 are formed two or more pieces of wiring 13 to be connected to above-described devices or other wiring built thereunder, as necessary, via conventionally known contact holes or via holes (not shown) which also are formed on the insulating film 12.

Each piece of wiring 13 has a stacked structure containing a large number of band-like refractory metal layer portions 14a comprised of a refractory metal layer composed of, for example, Ti materials and aluminum alloy layer portions 15a comprised of layers of aluminum alloy such as Al—Cu and Al—Si—Cu stacked on a refractory metal layer.

In the patterning process using photolithography described later, in order to suppress the reflection of irradiated light off the surface of the aluminum alloy layer 15, an anti-reflection coating 16 composed of, for example, TiN is formed on the aluminum alloy layer 15. In the example shown in FIG. 1, a residual part 16a of the anti-reflection coating is left on each of the aluminum alloy layer portion 15a.

Each of refractory metal layer portion 14a has a length L1 and is formed in an ranged manner along an extended direction of each wiring 13 with an interval Y1 interposed among them.

The aluminum alloy metal portion 15a of each wiring 13 is so formed along the extended direction of the wiring 13 that it covers two or more refractory metal layer portions 14a disposed directly under the metal portion 15a and arranged in a straight-line manner and that it is fitly put among refractory metal layer portions 14a, each being arranged with an interval Y1 interposed and with end parts disposed opposite to each other.

At an interface between the refractory metal layer portion 14a and the aluminum alloy metal portion 15a is produced a compound layer 17 formed by the reaction of aluminum with titanium being a material for refractory metal at the time of sputtering of the aluminum alloy layer 15 or of the heat treatment.

The compound layers 17 each having almost uniform thickness t1 are produced in accordance with heat history and in such a manner that they cover almost uniformly end faces and upper faces of each refractory metal layer portion 14a so as to cover the interface between the aluminum alloy layer portion 15a and each refractory metal layer portion 14a.

The interval y1 among refractory metal layer portions 14a is set to be larger than a value being twice as larger as a growth length t1 of the compound layer 17.

Therefore, though the compound layers 17 produced at the interface between the aluminum alloy layer portion 15a and the refractory metal layer portion 14a exist at end portions of each of refractory metal layer portions 14a which are disposed opposite to each other, since each of interrupting portions 15a-1 of the aluminum alloy layer portions 15a is surely put between end portions, each being paired with each other, of the refractory metal layer portions 14a, direct contact, in each wiring 13, will not occur between compound layers 17, being adjacent to each other, covering the refractory metal layer portions 14a, and by the interrupting portion 15a-1 of the aluminum alloy layer portions being interposed between the compound layers, the refractory metal layer 14a and the compound layer 17 are surely parted or separated in the extended direction of the wiring 13.

According to the wiring structure of the present invention, even if high resistance is generated partially due to electromigration in the aluminum alloy layer portion 15a, since each of the refractory metal layer portions disposed with an interval y1 under the aluminum alloy layer portion 15a of each wiring 13 functions as a bypass, it serves to prevent the wiring 13 from suffering from damage caused by generation of high temperature and to improve durability of the wiring 13.

Because each of the refractory metal layer portions 14a is parted by each of the interrupting portions 15a-1 of the aluminum alloy metal portion which is put between the refractory metal layer portions, and each of the interrupting portions 15a-1 is put between compound layers 17 preventing the compound layers 17 from contacting with each other and each of the compound layers 17 is parted in the longitudinal direction of the wiring 13, unlike in the case of the conventional wiring, a series of compound layers contacting with each other are not formed.

Since the occurrence of the electromigration in the aluminum alloy layer portions 15a is suppressed by parting or separation of the compound layers 17, the resistance against electromigration is more increased compared with the conventional case, thus allowing the improvement of durability of the wiring 13.

It is desirous that the length L1 of each refractory metal layer portion 14a is smaller than the Blech's critical length because if its length is larger than this critical one, the migration may occur. Though the Blech's critical length varies depending on stress of the aluminum alloy layer portion 15, it is approximately 100 $\mu$m. Therefore, the length L1 of each refractory metal layer portion 14a is preferably smaller than 100 $\mu$m.

A method for manufacturing the wiring structure 10 is hereinafter described by referring to FIGS. 2 and 3. By using, for example, a sputtering or CVD method, in order to coat the insulating film 12 formed on the semiconductor substrate 11, as shown in FIG. 2, the refractory metal layer 14 composed of titanium having a specified uniform thickness is formed.

Then, openings 18 are formed, with an interval L1, on the wiring region 13a, on which wiring is established, of the refractory metal layer 14 to make the insulating film formed under the refractory metal layer 14 exposed partially.

Figure 2:
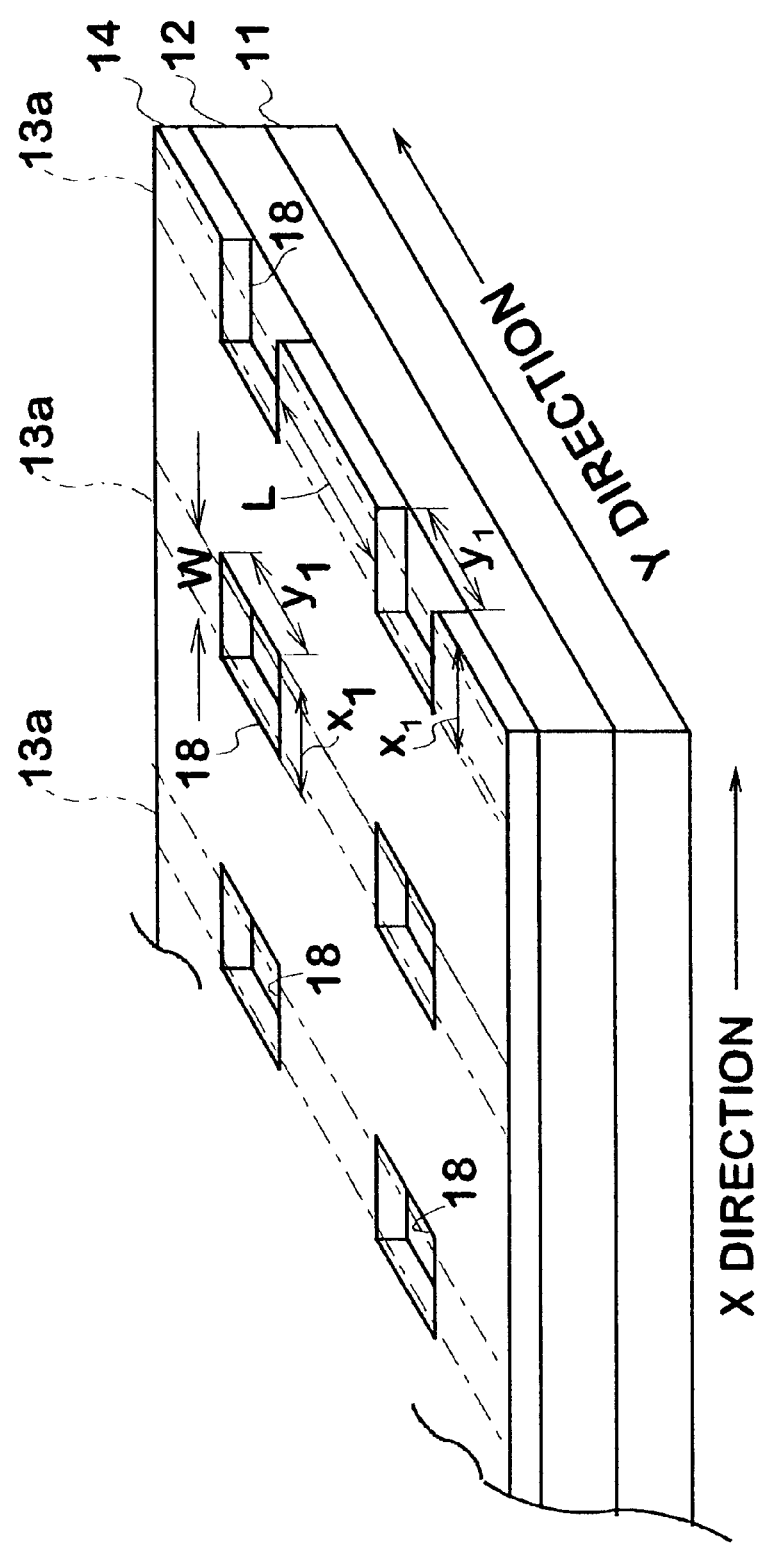
FIG. 2 is a perspective view showing a process for forming refractory metal layers in the method for manufacturing the wiring of the present invention.

As shown in FIG. 2, the opening 18 is a rectangular opening having one side x1 in the X direction and the other side y1 in the Y direction. The opening of this kind 18 can be formed by using a well-known photolithography and etching method. Moreover, a well-known dry etching using a fluorine or chlorine etching gas as an etching medium is preferably used.

The direction of the one side x1 of the opening 18 is matched with the direction of the width W of the wiring region 13a and the width represented by the one side x1 is set to be larger than the width W. This makes it possible to form the refractory metal layer portion 14a to be surely parted or separated regardless of variations in manufacturing errors.

The length of the other side y1 of the opening 18 disposed in the extended direction of the wiring region 13a being also matched with that of the wiring 13 is set to exceed a value being twice as larger as the thickness of the compound layer 17 produced at the interface between the refractory metal layer 14 and the aluminum alloy metal layer 15. The interval L1 between openings 18 arranged on each of the wiring regions 13a is preferably set to be shorter than the Blech's critical length described above.

Figure 3:
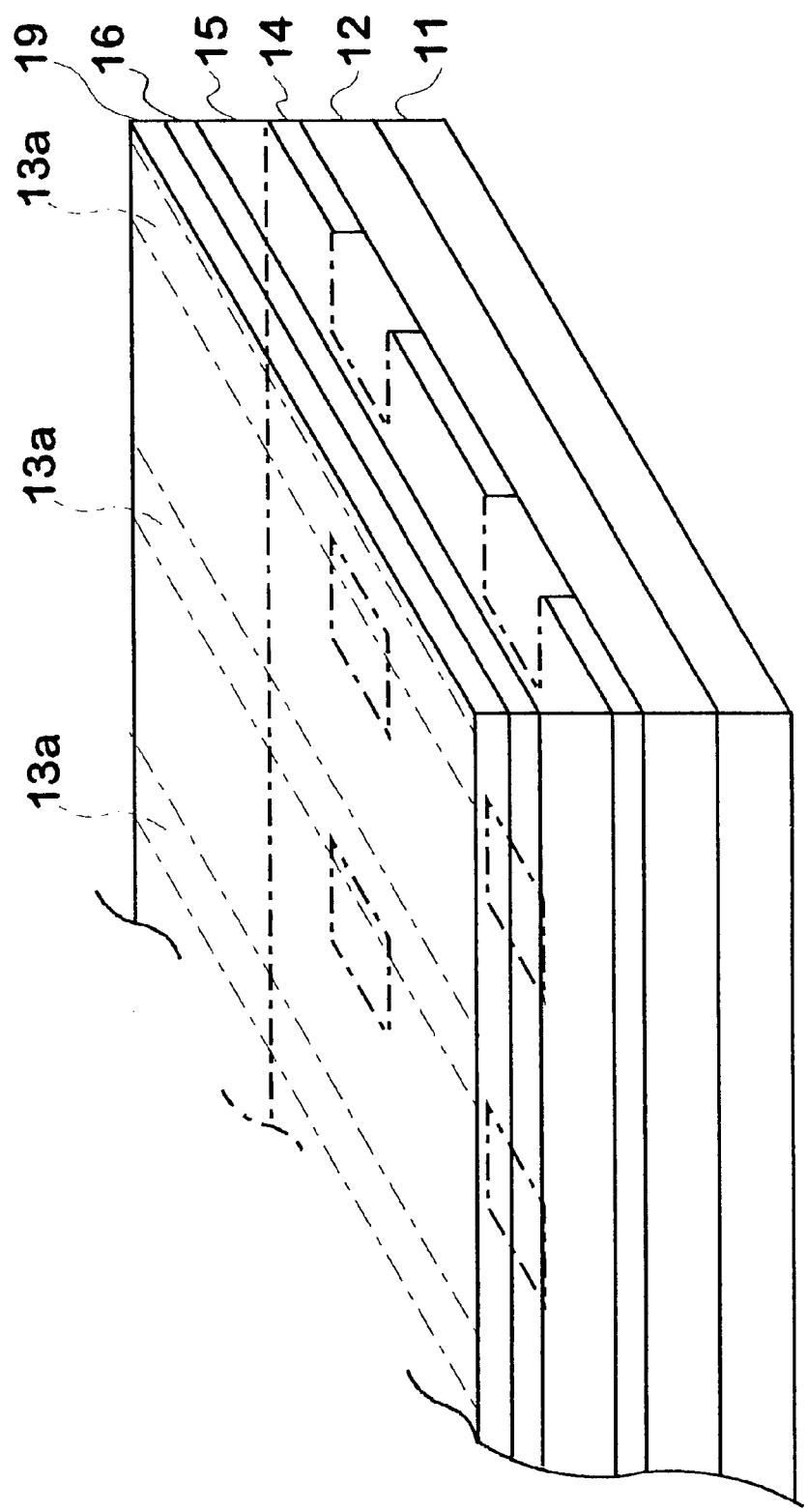
FIG. 3 is a perspective view illustrating wiring patterning processes in the method for manufacturing the wiring of the present invention.

After the opening 18 is formed on the refractory metal layer 14, as shown in FIG. 3, the aluminum alloy layer 15 is formed on the refractory metal layer 14 in a manner to cover the opening 18. The aluminum alloy layer 15 can be formed to have a specified thickness by using the well-known sputtering or CVD method. On the aluminum alloy layer 15, if necessary, is formed the anti-reflection film 16 composed of, for example, TiN, and on the anti-reflection film 16 is coated with a photoresist 19 for patterning.

A pattern corresponding to the wiring region 13a is projected on the photoresist by light exposure. By a subsequent development processing, a resist pattern composed of the photoresist 19 left to respond to the wiring region 13 is formed and by the well-known dry etching technique using the resist pattern as an etching mask, a lower layer corresponding to the wiring region 13a is made left and unnecessary part is taken off. By performing this selective etching, each wiring 13 composed of residual lower layers is formed.

Figure 4:
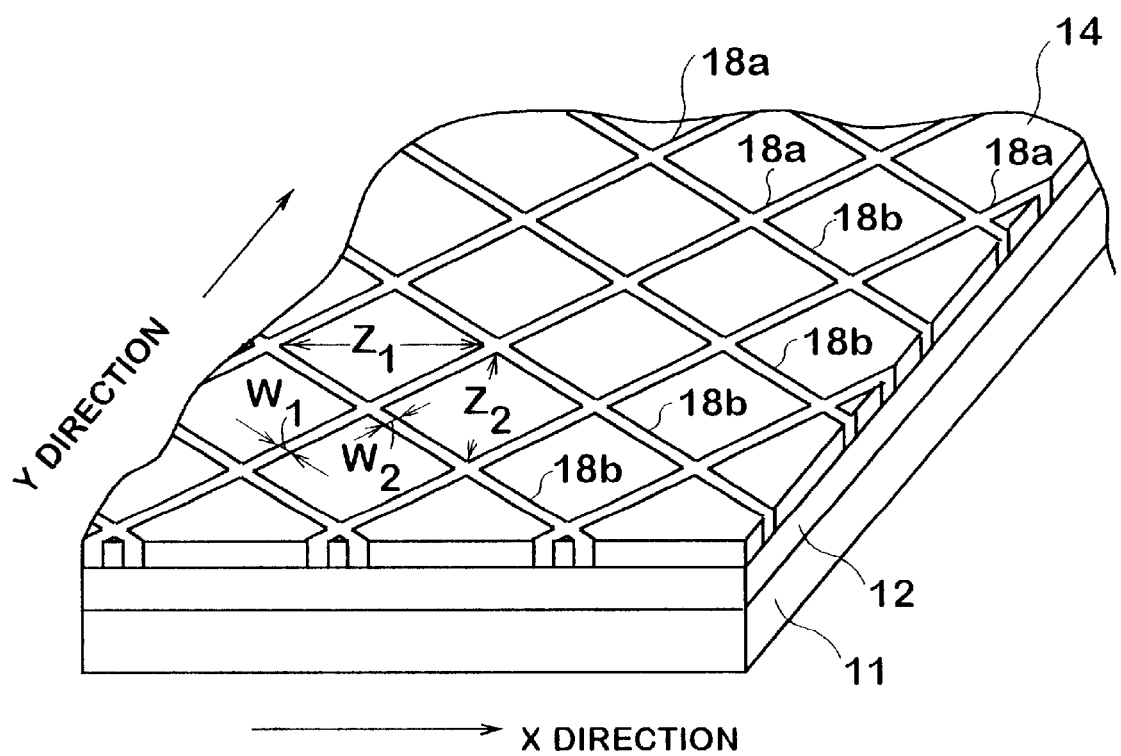
FIG. 4 is a diagram illustrating a modified process for forming the refractory metal layer shown in FIG. 2 in the method for manufacturing the wiring of the present invention.

In the above embodiment, it is shown that many openings, i.e., etching holes 18 arranged in the wiring regions 13a are formed by performing etching processing on the refractory metal layer 14. However, as shown in FIG. 4, instead of forming a plurality of etching holes 18 on the refractory metal layer 14, by using the photolithography and etching methods, etching trenches 18a and 18b may be formed in the shape of a lattice on the refractory metal layer 14 on the insulating film 12.

The widths w1 and w2 of intersecting etching trenches 18a and 18b are set to be larger than that of the compound layer. A crossed angle of the etching trenches 18a and 18b may be 90 degrees or may be smaller or larger than the 90 degrees if necessary. Moreover, the lengths z1 and z2 of diagonal lines of the rectangular portions partitioned by lattice-like etching trenches 18a and 18b of the refractory metal layer 14 are preferably smaller than the Blech's critical length.

The lattice-like etching trenches 18a and 18b in the refractory metal layer 14 make the insulating film 12 disposed thereunder exposed in a lattice manner. Similarly, when the aluminum alloy layer 15 is formed on the refractory metal layer 14, because the aluminum alloy layer 15 enters each of etching trenches 18a and 18b, interrupting portions 15a-1 are formed in a lattice manner as described above.

The selective etching is performed on the stacked structure having the refractory metal layer 14 and the aluminum alloy layer 15 by using the same patterning and etching processing as shown in FIG. 3

At this point, since the etching trenches 18*a* and 18*b* to receive the interrupting portion 15*a*-1 of the aluminum alloy layer 15 are formed in a lattice manner, even if the wiring regions 13*a* on the refractory metal layer 14 is deviated in terms of an angle from the Y direction, for example, shown in FIG. 4 or even if the wiring region 13*a* is displaced in the X direction, regardless of such variations, the parted region can be formed on each wiring 13, which is extended at an oblique angle with respect to its extended direction, thus allowing ensured formation of the interrupting portion 15*a*-1 that serves to part the refractory metal layer 14*a* regardless of errors in the patterning. Therefore, as shown in FIG. 4, the similar wiring 13 as described above can be formed easily.

Figure 5:
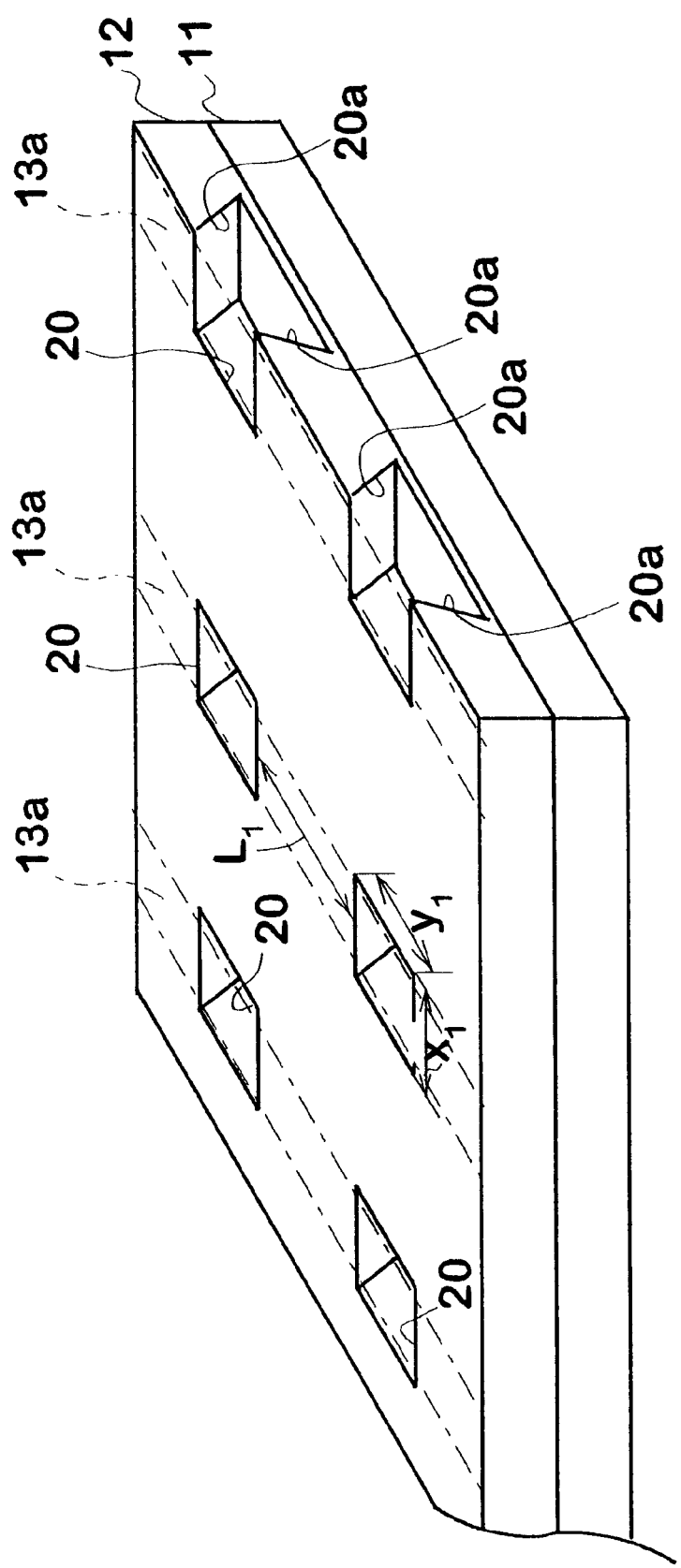
FIG. 5 is a perspective view illustrating etching processing performed on an insulating layer according to another embodiment for the method for manufacturing the wiring of the present invention.

Furthermore, instead of performing etching processing on the refractory metal layer 14 on the insulating film 12, as shown in FIG. 5, a plurality of concave portions 20 may be formed in advance on the insulating films 12 on which the refractory metal layer 14 is stacked. These concave portions 20 are formed with intervals L1 as in the case of the openings 18. The interval L1 is preferably set to be smaller than the Blech's critical length.

The concave portion 20 is a rectangular opening having one side x1 along the X direction across the wiring region 13*a* and the other side y1 along the extended direction of the wiring region 13*a*. The length of the one side x1 is larger than the width of the wiring region 13*a* while the other side y1 exceeds a value being twice as large as the thickness of the compound layer 17.

The distance between paired side walls 20*a* and 20*a* being opposite to each other increases as it moves from its top part constituting the opening to its bottom part. The concave portion 20 is so configured to have a sufficient large depth so that the refractory metal layer portion stacked in the concave portion and the refractory metal layer portion 14 disposed on the insulating film 12 may not overlap partially each other. The concave portion 20 can be formed by using a well-known etching method.

Figure 6:
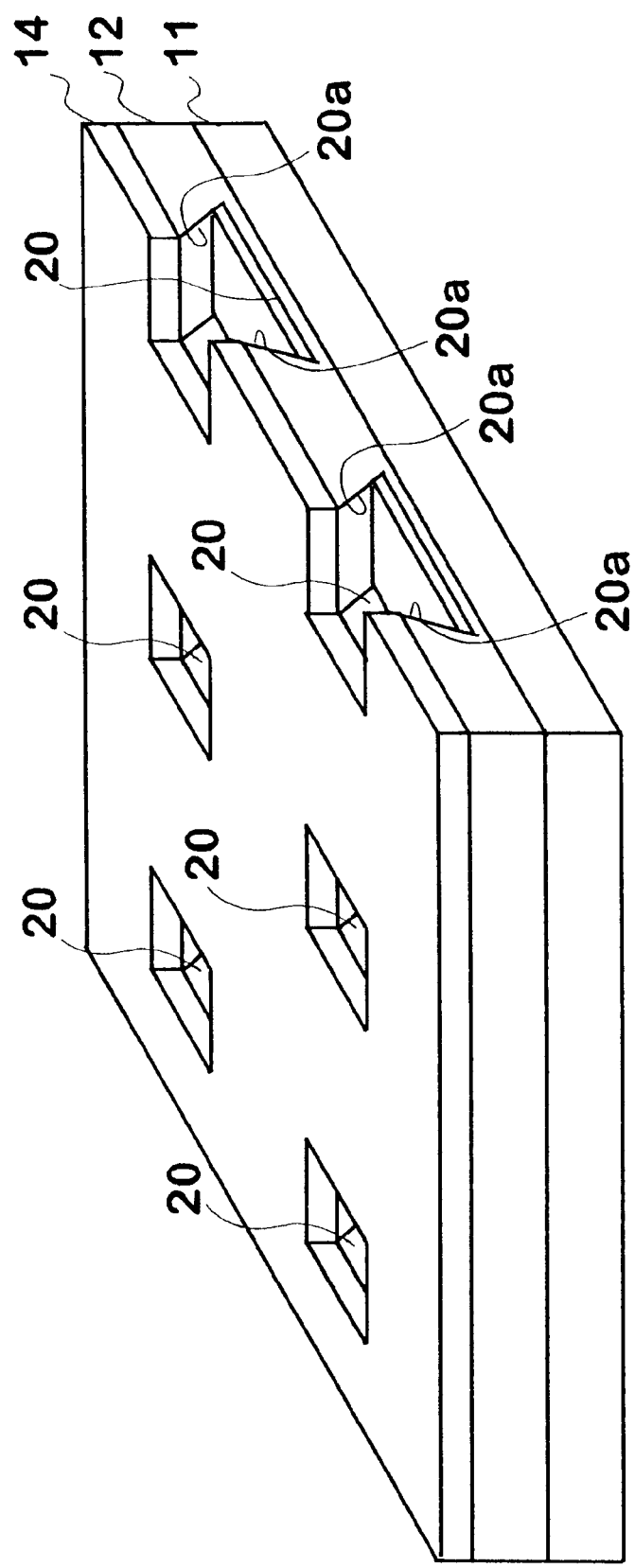
FIG. 6 is a diagram showing a process for forming the refractory metal layer according to other embodiment for the method for manufacturing the wiring of the present invention.

After the formation of the concave portion 20, by using the sputtering or CVD method, on the insulating film 12 is stacked the refractory metal layer 14. When this refractory metal layer 14 is stacked, by providing orientation to its growth, as shown in FIG. 6, the refractory metal can be prevented from growing toward paired side walls 20*a* and 20*a* of the concave portion 20. As a result, though the refractory metal is stacked at the bottom of the concave portion 20, the stacked refractory metal does not contact the refractory metal layer 14 stacked on the surface of the insulating film 12.

Figure 7:
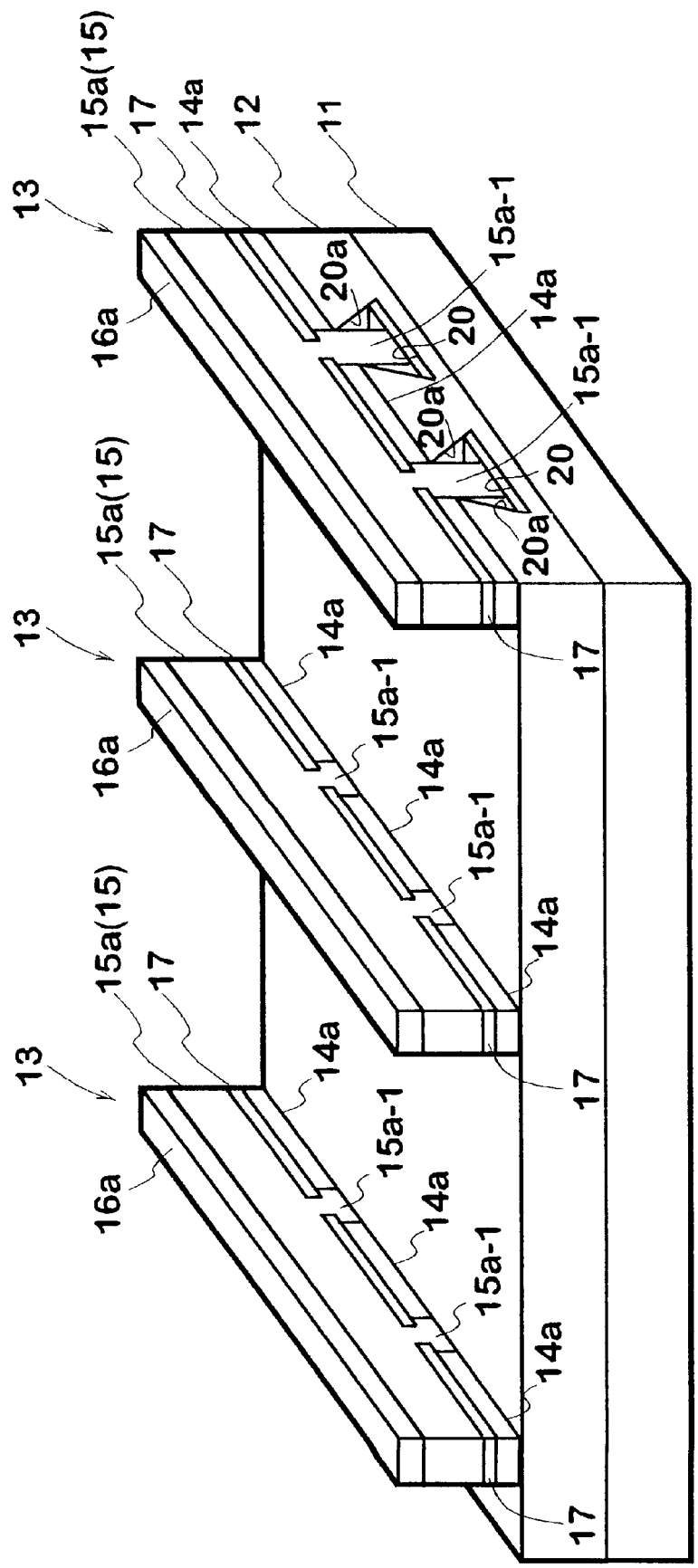
FIG. 7 is a perspective view of the wiring structure, parts being broken away for clearness, formed by the method for manufacturing the wiring of the present invention.

After the stacking of the refractory metal layer 14, in the same manner as above, the aluminum alloy layer 15 is stacked on the refractory metal layer 14. As depicted in FIG. 7, by the stacking of the aluminum alloy layer 15, the interrupting portion 15*a*-1 extends into the concave portion 20.

After the aluminum alloy layer 15 is formed, the anti-reflection film 16 is formed if necessary and, by using the photolithography and etching method, unnecessary part is selectively taken off and the wiring 13 is formed as shown in FIG. 7.

As depicted in FIG. 7, the extension of the interrupting portion 15*a*-1 of the aluminum alloy layer 15 between compound layers 17 produced between the aluminum alloy layer 15 and the refractory metal layer 14 can surely prevent the compound layers 17 from ranging in the extended direction of the wiring 13 and from contacting with each other.

As is in the case of configuration shown in FIG. 1, since the occurrence of the electromigration in the aluminum alloy layer portions 15*a* is suppressed by parting or separation of the compound layers 17, the resistance against electromigration is more increased compared with the conventional case, thus allowing the improvement of durability of the wiring 13.

According to the wiring structure of the present invention, since the refractory metal layer disposed under the aluminum alloy layer is parted in the extended direction, the aluminum compound layers produced between the aluminum alloy layer and the refractory metal layer do not range in the extended direction of the wiring, thus preventing the decrease in the resistance against electromigration caused by the ranged compound layers and allowing a life of the wiring to be lengthened accordingly.

Moreover, according to the method for manufacturing the wiring of the present invention, as described above, by etching processing performed on the insulating film or refractory metal layer, the refractory metal layer disposed under the aluminum alloy layer can be formed in a manner that the refractory metal layer is parted or separated, and therefore the wiring structure in which the refractory metal layer is parted in the extended direction of the wiring can be easily produced.

It is apparent that the present invention is not limited to the above embodiments but may be changed and modified without departing from the scope and spirit of the invention.

What is claimed is:

1. A wiring structure for a semiconductor device comprising:

a refractory metal layer formed on a semiconductor substrate;

an aluminum alloy layer stacked on said refractory metal layer;

a stacked structure wherein a layer of a compound composed of aluminum contained in said aluminum alloy and of a metal contained in said refractory metal is produced between said both layers;

whereby said refractory metal layer is parted by said aluminum alloy layer in an extended direction of wiring and a length of an interval between parted refractory metal layer portions exceeds a value being twice as large as a thickness of said compound layer.

2. The wiring structure according to claim 1, wherein a length of said refractory metal layer portion in the direction of said wiring is smaller than Blech's critical length.

3. The wiring structure according to claim 1, wherein said parted region between said refractory metal layer portions extends at an oblique angle with respect to an extended direction of said wiring.

4. The wiring structure according to claim 1, wherein said refractory metal layer is stacked on an insulating layer formed on said semiconductor substrate.

5. The wiring structure according to claim 4, wherein said insulating layer, on which said refractory metal layers are stacked, is provided with a concave portion in which a distance between its side walls being opposite to each other increases as it moves from its top part to its bottom part.

6. The wiring structure according to claim 1, wherein said refractory metal layer is composed of titanium.

* * * * *